(12) United States Patent
Hayes

(10) Patent No.: US 6,792,011 B2
(45) Date of Patent: Sep. 14, 2004

(54) FREQUENCY MODULATED LASER WITH HIGH MODULATION BANDWIDTH

(75) Inventor: Robert R. Hayes, Calabasas, CA (US)

(73) Assignee: HRL Laboratories, LLC, Malibu, CA (US)

(*) Notice: Subject to any disclaimer, the term of this patent is extended or adjusted under 35 U.S.C. 154(b) by 91 days.

(21) Appl. No.: 09/838,676

(22) Filed: Apr. 19, 2001

(65) Prior Publication Data

US 2002/0176456 A1 Nov. 28, 2002

(51) Int. Cl.[7] .............................. H01S 3/10; H01S 3/097

(52) U.S. Cl. .............................. 372/28; 372/26; 372/83; 372/84

(58) Field of Search .............................. 372/26, 28, 81, 372/83, 84

(56) References Cited

U.S. PATENT DOCUMENTS

| | | | |
|---|---|---|---|
| 3,573,653 A | 4/1971 | Smiley | 331/94.5 |
| 3,666,982 A * | 5/1972 | Wiegand, Jr. | 372/83 |
| 4,064,465 A * | 12/1977 | Hundstad et al. | 372/83 |
| 4,166,252 A * | 8/1979 | Salzmann et al. | 372/84 |
| 4,258,335 A * | 3/1981 | Donon | 372/83 |
| 4,596,018 A * | 6/1986 | Gruber et al. | 372/87 |
| 4,665,526 A * | 5/1987 | Shipman et al. | 372/83 |
| 5,008,893 A | 4/1991 | Amann et al. | 372/50 |
| 5,082,342 A * | 1/1992 | Wight et al. | 385/8 |
| 5,222,087 A | 6/1993 | Thulke et al. | 372/20 |
| 5,311,526 A * | 5/1994 | Gorfinkel et al. | 372/26 |
| 5,325,382 A | 6/1994 | Emura et al. | 372/26 |
| 5,333,141 A | 7/1994 | Wolf et al. | 372/20 |
| 5,475,703 A * | 12/1995 | Scalise et al. | 372/82 |
| 5,481,559 A | 1/1996 | Kawamura | 372/50 |
| 5,574,818 A | 11/1996 | Krivoshlykov | 385/122 |
| 5,596,593 A * | 1/1997 | Crothall et al. | 372/87 |
| 5,602,865 A * | 2/1997 | Laakmann | 372/82 |
| 5,684,821 A * | 11/1997 | Murray et al. | 372/84 |
| 5,748,663 A * | 5/1998 | Chenausky | 372/82 |
| 5,751,749 A | 5/1998 | Yokozawa et al. | 372/32 |

FOREIGN PATENT DOCUMENTS

| | | |
|---|---|---|
| EP | 0 867 990 | 9/1998 |
| JP | 53-63896 | 6/1978 |

OTHER PUBLICATIONS

Kohler, Fabian, et al., "Transverse Laser–Modulator–Integration for Wavelength Tunable Laser Diodes," *Walter Schottky Institute, Technische Universitat Munchen, Annual Report 1998*, pp. 60–61.

Guilfoyle, Peter S., et al., "Tunable DBR Lasers for Photonic Random Optical Memory Access (PROMAC)," *Laser Diode Technology and Applications V, Proc. SPIE*, vol. 1850–35, pp. 292–299 (Jun. 1993).

Endo, M., "A Wide–Band RF Activated Electrooptic Laser Beam Modulator", THAM 5–4, IMTC '94, pp. 943–946 (May 1994).

Huang, X., et al., "Monolithically Integrated Quantum–Confined Stark Effect Tuned Laser with Uniform Frequency Modulation Response," *IEEE Photonics Technology Letters*, vol. 10, No. 12, pp. 1697–1699 (Dec. 1998).

(List continued on next page.)

*Primary Examiner*—Don Wong
*Assistant Examiner*—James Menefee
(74) *Attorney, Agent, or Firm*—Ladas & Parry

(57) ABSTRACT

A frequency modulated laser comprises a laser cavity in which the gain section of the laser cavity is imbedded within a phase modulation section of the cavity. The laser cavity further comprises electrically-sensitive material, so that an electric field applied across the laser cavity changes the index of refraction within the laser cavity according to the magnitude of the change in the electric field. Uniformly and simultaneously changing the index of refraction along the laser cavity length modulates the frequency of the laser light produced within the laser cavity. The upper bound of the frequency modulation is limited by the propagation time for the electric field to cross the laser cavity.

26 Claims, 4 Drawing Sheets

OTHER PUBLICATIONS

Amann, M.C., et al., "Tunable twin–guide laser: A novel laser diode with improved tuning performance," *Applied Physics Letters*, vol. 54, No. 25, pp. 2532–2533 (Jun. 1989).

Wolf, T., et al., "Tunable twin–guide lasers with flat frequency modulation response by quantum confined Stark effect," *Applied Physics Letters*, vol. 60, No. 20, pp. 2472–2474 (May 18, 1992).

* cited by examiner

FREQUENCY MODULATED LASER WITH HIGH MODULATION BANDWIDTH

STATEMENT OF GOVERNMENT INTEREST

The United States Government has rights in this invention pursuant to a Contract between the United States Government and HRL Laboratories, LLC.

FIELD OF THE INVENTION

The present invention relates to frequency modulation of optical signals, and, more particularly, a frequency modulated laser that can be modulated at almost unlimited modulation rates.

BACKGROUND OF THE INVENTION

Modulation of information onto optical signals is well-known in the art. One modulation technique used for modulating optical signals is frequency modulation, which allows an improvement in Signal to Noise Ratio (SNR) by utilizing a transmission bandwidth that is larger than the signal bandwidth. Of key interest in frequency modulating optical signals, is the wide bandwidth available for frequency modulation due to the high carrier frequency in optical signals used for information transmission. Typically, communication systems offer bandwidths that are about 10% of the carrier frequency. A 1.5 μm optical system, with a carrier frequency of 200,000 GHz, has, therefore, 20,000 GHz of instantaneous bandwidth. This provides the ability to modulate data at extremely large data rates onto the optical signal.

To take advantage of the wide bandwidths available at optical frequencies, apparatus and techniques must be used that provide for high modulation bandwidths. One approach is to couple an optical laser source with an external optical frequency modulator (i.e., a phase modulator with an appropriate driver). External modulators may require complex traveling wave structures that match the propagation velocities of the modulating RF field and the optical carrier. Another, less complex, approach is to directly frequency modulate the optical laser source.

Frequency-modulated lasers are well-known in the art. A conventional technique for providing a frequency-modulated semiconductor laser is to directly modulate the drive current of a Distributed Feedback (DFB) laser. Modulation of the drive current provides about 150 to 300 MHz of frequency shift per milliamp of drive current for commercial DFB lasers, yielding a maximum frequency swing of 10–20 GHz. This approach has two significant drawbacks. First, modulation of the drive current produces significant amplitude modulation, which is undesirable for FM communication systems. Second, an upper modulation rate of only about 20 GHz is achievable, due to semiconductor device limitations.

Another approach for providing a frequency-modulated laser is shown in FIG. 1. In FIG. 1, a laser cavity 10, as defined by the partial mirrors 15 at each end, comprises an optical gain section 11 combined with a phase modulator 13 of finite length. The partial mirrors 15 provide the required reflectivity for the lasing effect. The gain section 11 is typically a laser diode and the phase modulator 13 is a section in which the index of refraction is changed by the application of either a voltage (Stark Effect) or an injection current. The inclusion of the phase modulator 13 within the laser cavity 10 converts any phase modulation produced by the phase modulator into frequency modulation. It does this by changing the effective optical cavity length, which changes the laser oscillation frequency accordingly.

Semiconductor lasers which provide for an active region and a phase modulation region are described by Emura et al., in U.S. Pat. No. 5,325,382, "Method and Electrode Arrangement For Inducing Flat Frequency Response In Semiconductor Laser," issued Jun. 28, 1994, and Kawamura, in U.S. Pat. No. 5,481,559, "Light Modulator Integrated Light-Emitting Device And Method Of Manufacturing The Same," issued Jan. 2, 1996. Emura et al. describe the application of a modulation current to both the active region and the phase modulation region to achieve a relatively flat frequency modulation response. Kawamura describes the provision of a ground electrode between the active region and the phase modulation region to isolate the electric field in the active region from the modulating electric field in the phase modulation region.

In the frequency-modulated laser shown in FIG. 1, the instantaneous frequency of the laser is given by:

$$f(t) = \frac{1}{2\pi}\frac{d\phi}{dt} = f_0 + \frac{\Phi_{0m}}{2\pi T_c}\frac{\text{sinc}(\omega T_p/2)}{\text{sinc}(\omega T_c/2)}\sin(\omega_m t + \vartheta) \quad (1)$$

where ω is the modulation frequency, $T_p$ is the round-trip transit time for light in the phase modulator, $T_c$ is the total round-trip transit time (phase modulator section+gain section) and $\Phi_{0m}$ is given by:

$$\Phi_{0m} = \frac{2\pi}{\lambda}\Delta n_0 2L_p \quad (2)$$

where $\Delta n_0$ is the electrically-induced change in the index of refraction, $L_p$ is the length of the phase modulator, and λ is the wavelength of the light generated by the laser.

Because $T_c$ will always be larger than $T_p$, the term in the denominator will approach zero first, and produce the resonant response shown in FIG. 2. The resonant frequency of $1/T_c$ prevents the use of this prior art modulator for applying frequency modulation in the vicinity of the resonant frequency, and thus limits the bandwidth of the modulator. Hence, this prior art modulator is not suitable for high-fidelity, high bandwidth analog optical links.

If the total round-trip travel time for the laser cavity, $T_c$ in equation 1 above, were identically equal to the round-trip travel time within the phase modulation section, $T_p$ in equation 1 above, the two sinc terms in equation 1 would cancel, and the frequency response would be flat. Creation of a frequency-modulated laser where $T_c$ equals $T_p$ would provide a FM laser with a perfectly flat response over an almost infinite bandwidth.

There are two ways to make $T_c$ equal $T_p$, one asymptotic, one absolute. The asymptotic approach is to make the length of the gain section very small compared to that of the phase modulation section, so that $T_c$ asymptotically approaches $T_p$. The absolute approach is to make the gain and phase modulation sections coincident, so that the length of the section in which no phase modulation occurs is zero.

One structure in which the gain and phase modulation sections are longitudinally coincident is the twin-guide structure developed by Amman et al, as shown in the laser device 300 of FIG. 3. In spite of its name, the twin-guide structure is actually a single-guide device. The laser device is split into two sections, one being the phase modulation section 310 or tuning zone, the other the gain section 320 or active zone. The relative indices of these two sections are both higher than that of the outside cladding regions 330, so that the optical mode is confined in the center, just as it is in an optical fiber. A thin doped center layer region 340 is used to forward-bias the gain section 320, so that the medium is inverted (for gain), and to back-bias the phase modulation section 310, so that the index of refraction within the laser cavity can be controlled, either by means of the electro-optic effect, or by a band-edge or quantum-confined Stark effect. A Bragg grating 350 etched into a substrate 370 provides internal reflection within the structure for feedback. The device shown in FIG. 3 actually uses forward bias in the phase modulation section in order to get large frequency excursions. However, others have made similar devices that use a reverse bias to control the dielectric constant (e.g. as described by Wolf et al., "Modulatable Laser Diode For High Frequencies," U.S. Pat. No. 5,333,141, issued Jul. 26, 1994.).

In operation, a laser current is applied at the laser electrode 361 to provide a constant current to the gain section 320 to provide the optical gain required for laser operation. A modulation current is applied at the modulation electrode 363 to control the index of refraction with the phase modulation section 310 for modulating the optical frequency of the laser structure 300.

The performance of the twinguide laser device 300 is limited either by the finite capacitance of the structure, if the phase modulation section is operated in the reverse bias mode, or by the recombination time of the injected carriers, if operated in the forward bias mode. For reverse-biased structures, the phase modulation section 310 and the center layer region 340 act as a capacitor, thus providing a finite capacitance. This capacitance limits the frequency of the modulation signal that can be applied to the modulation electrode 363. The capacitance may be reduced by reducing the size of the phase modulation section 310, but this will reduce the maximum frequency excursion provided by the device. Forward-biased devices are capable of relatively large frequency swings, but have a maximum modulation rate of 200 MHz, due to the recombination time of the injected carriers.

In addition, the modulation frequency provided by the twinguide laser device 300 is limited by the radio frequency characteristics of applying a high frequency signal at the center of the modulation electrode 363. The modulation electrode 363 is a relatively long and narrow metal layer, such that a high frequency signal applied at the center of the electrode will propagate away from the center of the electrode towards the ends of the electrode and then reflect from those ends back to the center. The electric field that results from the applied high frequency signal will, therefore, not cause an equal change in the index of refraction within the laser cavity simultaneously. As the frequency of the modulation signal becomes higher, or the length of the device becomes longer, the radio frequency propagation effect reduces the modulation effectiveness of the twinguide laser device 300, when operated without a transverse-driving electrode. As described below, the transverse-driving electrode of the present invention provides improved modulation effectiveness.

Existing apparatus and methods for generating frequency-modulated light have limitations that restrict the modulation of light at extremely high modulation frequencies. The speed of direct modulation in a laser diode is limited by photon lifetimes and the lifetimes of the injected carriers. External frequency (phase) modulators that use changes in the index of refraction must employ traveling wave structures that match the propagation velocities of the RF and optical fields. The higher the modulation frequency, the more difficult it is to achieve this velocity match.

Therefore, there still exists a need in the art for apparatus and methods that provide for very high bandwidth frequency modulation of optical signals.

SUMMARY OF THE INVENTION

Accordingly, it is an object of the present invention to provide apparatus and methods for providing high bandwidth frequency modulation of optical signals.

High modulation rates for frequency modulated lasers are provided by embodiments of the present invention by making the gain and phase modulation sections of the laser cavity longitudinally coincident and by changing the index of refraction within the phase modulation section uniformly and simultaneously in time. The index of refraction is changed by passing the modulating field over a laser cavity transversely, so that the entire length of the laser cavity sees the same time element of the modulating field at the same time. The laser cavity must be either partially or totally filled with a material that will change its index of refraction in the presence of an electric field. Note that, according to the present invention, the index of refraction throughout the entire laser cavity does not have to be uniformly changed, but only that the index if refraction along an entire lengthwise portion of the laser cavity be uniformly and simultaneously changed. A traveling wave structure is used to apply the electric field to the laser cavity such that the radio frequency field in the traveling wave structure propagates perpendicularly to the direction of light propagation. The traveling wave structure does not need to match the propagation velocities of the light and RF fields, since the two fields propagate in orthogonal directions.

One embodiment of the present invention is provided by a frequency-modulated laser comprising: a laser cavity comprising an electrically-sensitive material, said laser cavity having a length dimension and width dimension, and said laser cavity producing laser light propagating substantially parallel to the length dimension of the laser cavity; and means for applying an electric field across said laser cavity, said electric field propagating in a direction substantially perpendicular to the direction of propagation of laser light within the laser cavity. The electric field is applied to change the index of refraction throughout the laser cavity substantially simultaneously and homogeneously with changes in the electric field. The laser cavity may be provided by the active region within a laser semiconductor structure or by a laser cavity within a pumped laser.

Another embodiment of the present invention is provided by a method for frequency modulating a laser light signal with an electrical signal, said method comprising the steps of: providing a laser cavity with a length and width, the laser cavity providing a lasing condition; producing laser light within the laser cavity, the laser light propagating in a direction substantially parallel to the length dimension of the laser cavity; maintaining the lasing condition with energy applied to a gain medium within said laser cavity; applying the electrical signal across said laser cavity to produce an electric field; the electric field uniformly and simultaneously changing the index of refraction along the entire laser cavity length in proportion to the amplitude of the electric signal; and transmitting the laser light out of the laser cavity to provide a frequency-modulated laser light signal.

Another embodiment of the present invention is provided by a frequency-modulated laser having a laser cavity fabricated of an electrically-sensitive material and a traveling wave structure disposed to apply a radio frequency field across the laser cavity, the radio frequency field propagating in the traveling wave structure in a direction substantially perpendicular to the direction of laser light propagating in the laser cavity. The changes in the radio frequency field change the index of refraction throughout the laser cavity substantially simultaneously and substantially uniformly. The laser cavity may be provided in a laser semiconductor structure, a pumped laser, or other laser structures known in the art. Preferably, the traveling wave structure comprises a transmission line and the laser cavity is disposed between the conductors of the transmission line such that the width of the conductors is greater than or equal to the length of the laser cavity at the point where the radio frequency field is applied across the laser cavity.

DETAILED DESCRIPTION OF PREFERRED EMBODIMENTS

Figure 1:
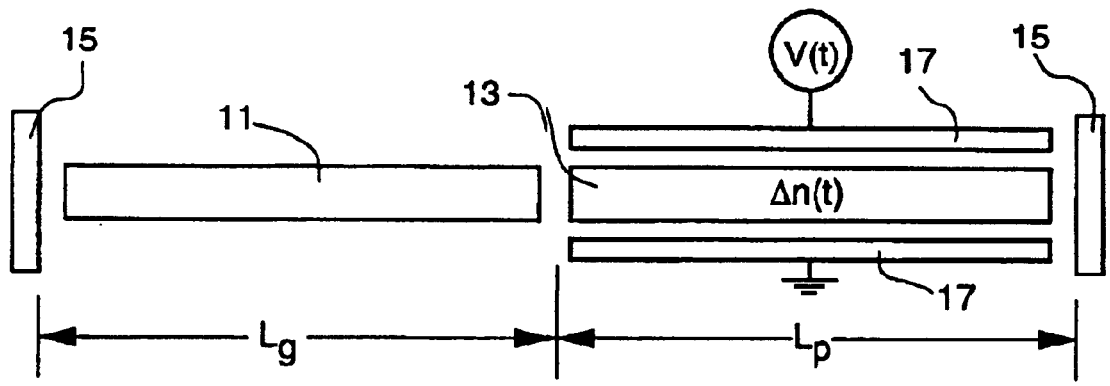
FIG. 1 (prior art) shows a structure of a conventional frequency modulated laser.
Figure 2:
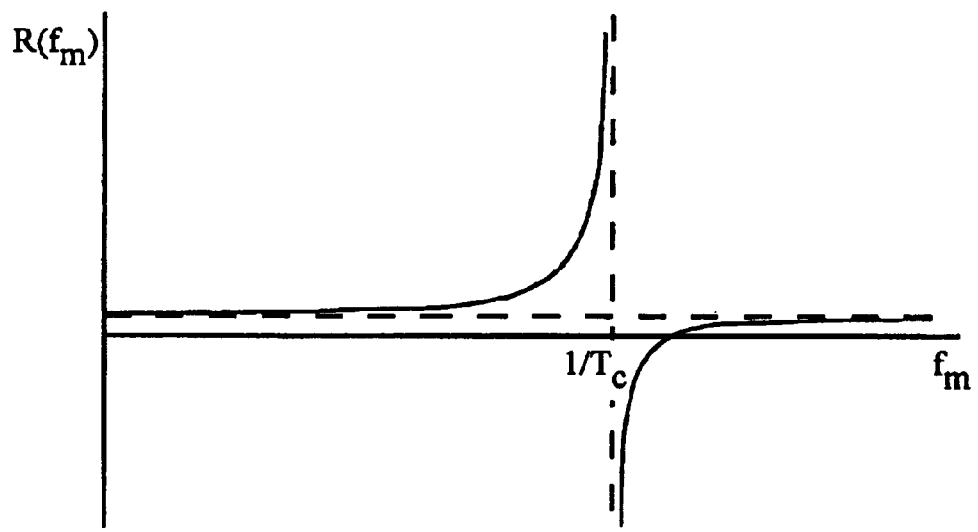
FIG. 2 shows a graph of the resonant response of a conventional FM laser.
Figure 3:
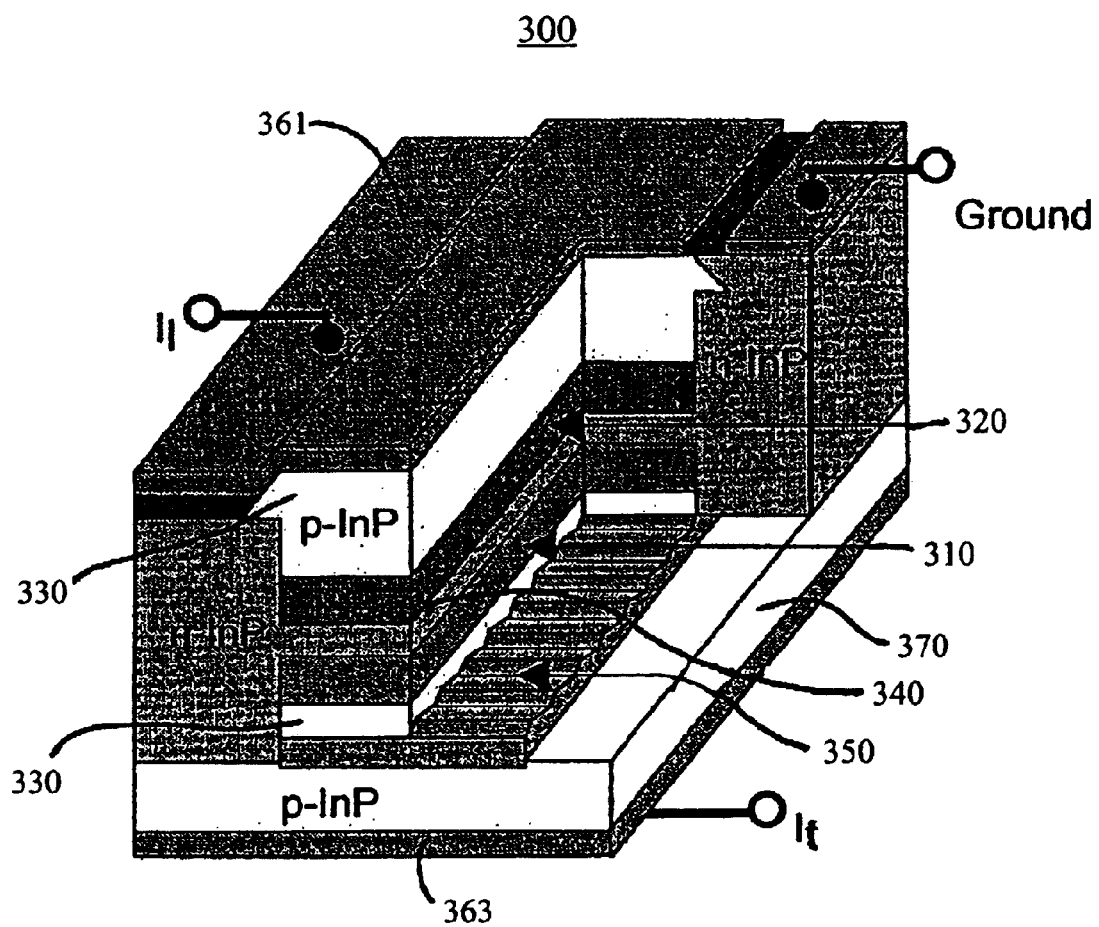
FIG. 3 (prior art) is a perspective view of a semiconductor structure of a laser diode providing coincident gain and phase sections.

The present invention will now be described more fully hereinafter with reference to the accompanying drawings, in which preferred embodiments of the invention are shown. This invention may be embodied in many different forms and should not be construed as limited to the embodiments set forth herein. In the drawings, the thicknesses of layers and regions are exaggerated for clarity.

The term "radio frequency" used in this application refers to propagating electro-magnetic waves with frequencies from DC through infrared frequencies. Hence, "radio frequency" as used in this application includes, but is not limited to, microwave and millimeter wave frequencies from several hundred megahertz to over a terahertz, as well as standard broadcast frequencies from tens of kilohertz to several hundred megahertz.

The function of the gain section in a laser is to slowly replace energy as light is emitted from the laser. If the spectral response of the gain section is sufficiently broad, it plays no fundamental role in determining the frequency of the laser. The frequency is determined entirely by the laser cavity. One can thus determine the FM response of a laser by determining the FM response of a lossless cavity (made lossless by the presence of the gain medium).

If the dielectric constant of the laser cavity can be changed, the frequency of the light emerging from the laser cavity changes as quickly as the dielectric constant of the laser cavity changes. This phenomenon arises since the light in the laser cavity consists of forward and backward traveling waves that interfere to form a standing wave pattern. Instantaneously changing the dielectric constant within the cavity does not change the field pattern, but it will change the rate at which the two waves move through each other, and hence the rate at which the standing wave pattern oscillates.

An ultra-bandwidth FM laser can then take advantage of this property of varying the frequency of the emitted light by varying the dielectric constant of the laser cavity. An ultra-bandwidth FM laser according to the present invention is provided by a laser comprising a laser cavity in which the dielectric constant of all or a portion of the cavity cross section can be changed uniformly along the longitudinal direction of the cavity, simultaneously in time. The laser cavity may include an index grating as the frequency-determining element, and, if so, the dielectric constant of this grating should be changed by the electric field. The laser cavity also comprises some form of gain medium to compensate for internal and external losses, thus maintaining the lasing condition.

The dielectric constant of a laser cavity changes when the index of refraction of the material comprising the laser cavity changes. The index of refraction of some optical materials can be changed by means of the electro-optic effect by an applied electric field, as is known in the art. Other effects known in the art, such as the band-edge and quantum-confined Stark effect, also result in a change of the index of refraction of an optical material in the presence of an applied electric field. In this application, optical material that has a changeable index of refraction in the presence of an electric field will be referred to as "electrically sensitive" material.

Figure 4:
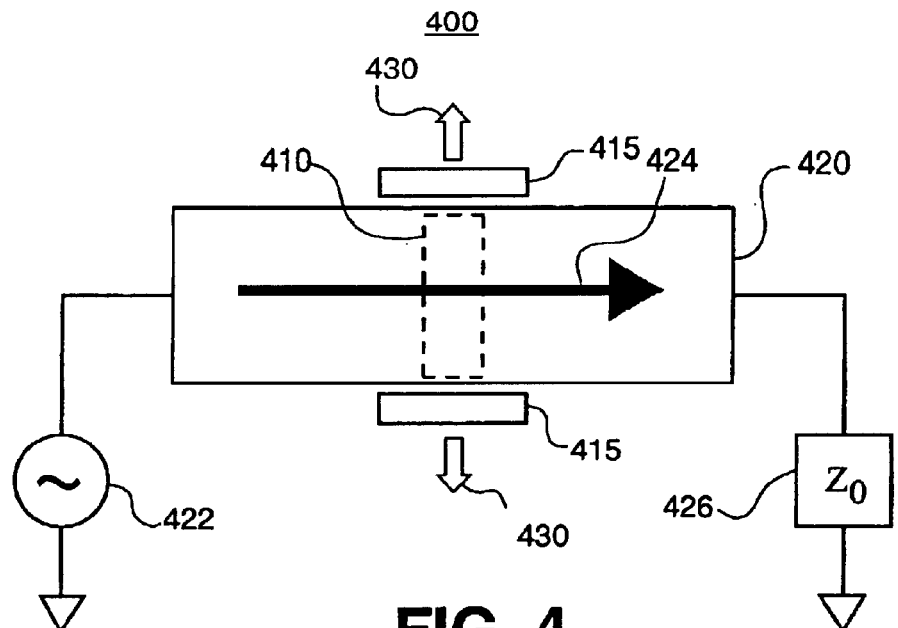
FIG. 4 is a simplified schematic diagram of a frequency-modulated laser according to the present invention.

A generalized laser structure 400 according to the present invention that provides homogeneous and simultaneous changes of the index of refraction within a laser cavity is shown in FIG. 4. In FIG. 4, a laser cavity 410 is covered by a broad electrode 420 that is part of a transmission line (the ground plane is not shown). The laser cavity 410 comprises an electrically sensitive material such that the index of refraction of the material changes with an applied electric field. An RF generator 422 applies an RF signal 424 to the electrode 420 so as to change the index of refraction within the laser cavity 410. Partial mirrors 415 provide the light reflection required to maintain the lasing condition and to couple laser light 430 out of the laser structure 400. The electrode 420 is terminated by an external impedance 426 having the characteristic impedance of the electrode 420 and its matching ground plane. In this configuration, every part of the laser cavity 410 will see the same temporal change in the index of refraction, regardless of how fast the RF signal is changing, since the RF signal 424 propagates unidirectionally along the electrode 420 and across the laser cavity 410.

In a variation of this approach, the electrode 420 stops at the right edge of the laser cavity 410, and is not terminated by the external impedance 426. This causes complete reflection of the traveling wave at the right edge of the laser cavity. The sum of the forward and reflected RF waves gives a field that has twice the amplitude of that for the configuration of FIG. 4, thus allowing one to achieve twice the index change for the same RF input power.

Figure 5:
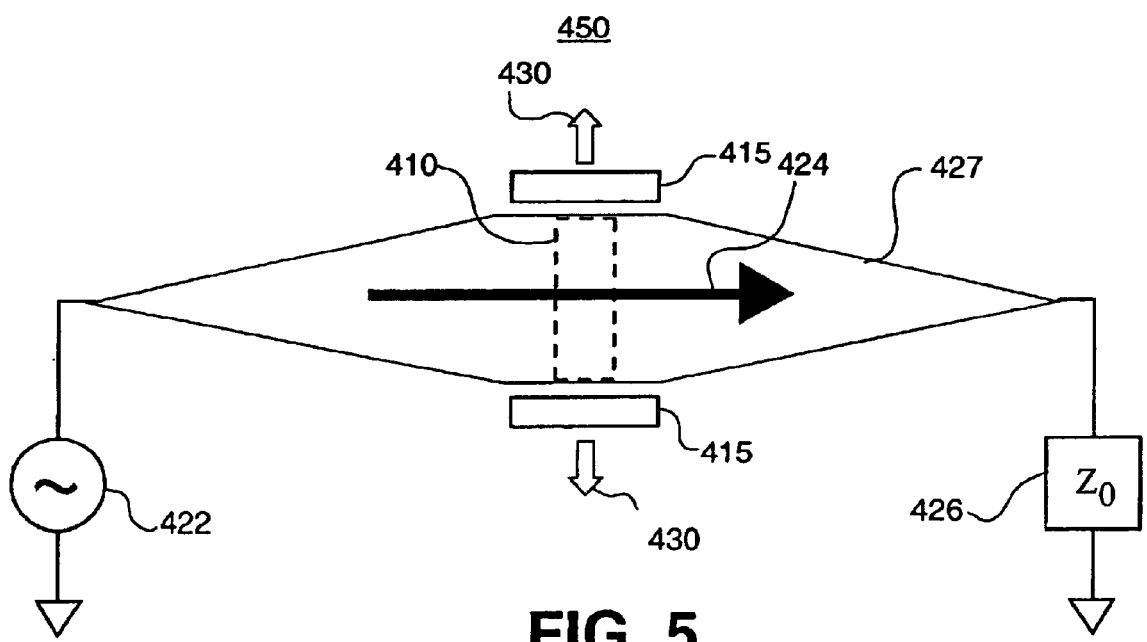
FIG. 5 is a schematic diagram of a frequency-modulated laser using a tapered electrode.

The electrode 420 and its matching ground plane (not shown) comprises a traveling wave structure that provides the ability to apply the same RF signal across all parts of the laser cavity 410 simultaneously. The electrode 420 and its matching ground plane may comprise traveling wave structures well-known in the art, such as standard microstrip, stripline, coplanar strip or other forms of transmission lines as well as other traveling wave structures such as slotline, coplanar waveguide, or even, with proper design, a rectangular microwave waveguide. Such traveling wave structures can provide a planar wavefront across the entire structure, and, thus, an RF field that is the same across all parts of a laser cavity disposed between the two parts of the transmission line. Standard microstrip or stripline transmission lines typically have a width of 1 mm. If the electrode 420 needs to be wider to cover a longer laser cavity, a small-angle taper in the electrode may be used to spread the RF field within the electrode uniformly. FIG. 5 shows a laser structure 450 according to another embodiment of the present invention in which a tapered electrode 427 is used.

The upper modulation rate will be limited by the time it takes the RF signal to cross the width of the laser cavity 410. Generally, the modulation response will start to drop when the time required to traverse this region corresponds to a 90° shift in RF phase. Equation 3, below, shows the maximum modulation frequency.

$$f_{max} = \frac{c}{4nw} \quad (3)$$

where c is the speed of light, n is the index of refraction, and w is the width of the laser cavity. Since the laser cavity width is typically measured in microns, the maximum modulation frequency will be quite high. For example, a laser cavity width of 10 microns (a typical optical waveguide width) and an index of refraction (n) of 3 provides a maximum modulation frequency $f_{max}$=2500 GHz. For the variant mentioned earlier, in which the RF field propagates first forward, and then backward across the laser cavity, the maximum modulation frequency would be half of this, or 1250 GHz for the example above.

The laser cavity 410 of the laser structure 400 depicted in FIG. 4 may be the laser cavity of a semiconductor laser. However, the phase modulation section and the gain modulation sections of the laser cavity must be substantially coincident to avoid the bandwidth limitations caused by the resonant response conditions discussed above. As previously discussed, the twin guide structure disclosed by Amman et al provides a semiconductor laser structure in which the gain and phase modulation sections are longitudinally coincident. However, unlike the twin guide structure previously discussed, the present invention utilizes an electrode structure that causes the index of refraction within the laser cavity to change simultaneously and uniformly along the length of the laser cavity at all modulation frequencies. Other semiconductor laser structures may also be used as long as they provide a laser cavity in which the phase modulation section and the gain section are substantially coincident and which allow a uniform electric field to be applied to change the index of refraction along the laser cavity length simultaneously and uniformly. If internal index gratings are used within the laser cavity, frequency modulation is obtained by changing the dielectric constant of the gratings with the applied electric field.

Figure 6:
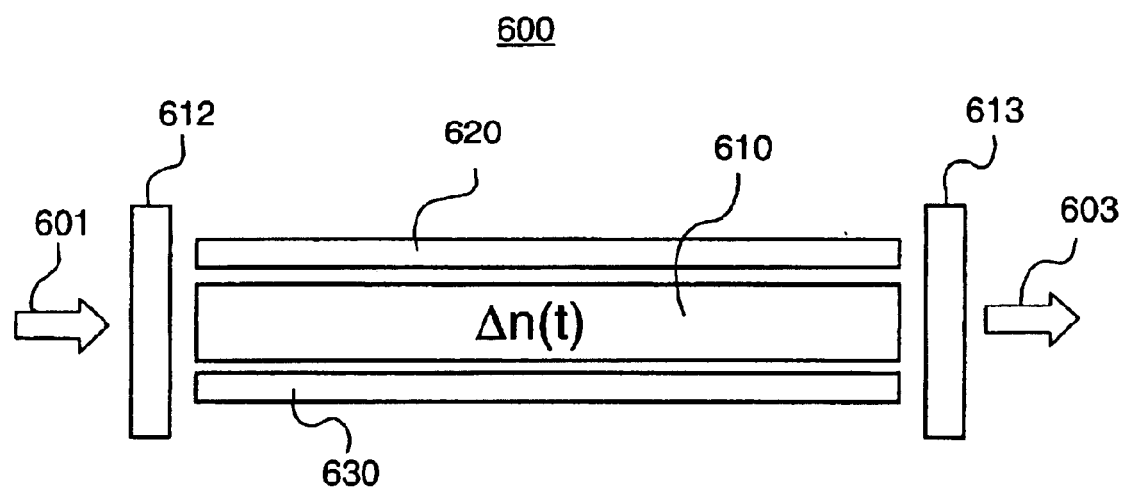
FIG. 6 is a simplified side-view of a frequency-modulated pumped laser according to an embodiment of the present invention.

Embodiments of the present invention are not limited to semiconductor laser structures. An alternative embodiment of the present invention provided by a pumped laser 600 is shown in FIG. 6. In the pumped laser 600 shown in FIG. 6, a laser cavity 610 is disposed between a first mirror 612 and a second mirror 613. Preferably, the first mirror 612 is a wavelength-tuned mirror that allows for end pumping of the laser cavity 610 by the application of pump energy light 601 at one wavelength, while reflecting laser light at another frequency. The second mirror 613 preferably comprises a partial mirror that transmits a portion of the laser light within the laser cavity 610 to provide a modulated laser signal 603. Side pumping of the laser cavity 610 may also be used in accordance with the present invention.

The laser cavity 610 comprises an electrically sensitive material that preferably uses a dopant to produce the required gain. For example, electro-optically active lithium niobate ($LiNbO_3$) crystals can be grown having either erbium or ytterbium as the dopant. Use of either erbium or ytterbium as the dopant may require the laser cavity to be several centimeters long to achieve the necessary laser gain. Fabrication of doped $LiNbO_3$ crystals of that length, or longer, is known in the art.

The laser cavity 610 is disposed between two electrodes 620, 630 that apply an electric field across the entire length and width of the laser cavity. The electric field that results changes in proportion to changes in an RF signal applied to the two electrodes 620, 630, thus changing the index of refraction within the electro-optically active material of the laser cavity 610. Since the electrodes span both the length and width of the laser cavity, the index of refraction changes simultaneously and homogeneously along the laser cavity length. Hence, the laser cavity 610 disposed between the electrodes 620, 630 acts as both the gain section and the phase modulation section of the pumped laser. The laser cavity may include an index grating as one of the frequency-determining elements, but if so, modulation of the frequency of the laser is achieved by changing the dielectric constant of the grating with the applied electric field.

Figure 7:
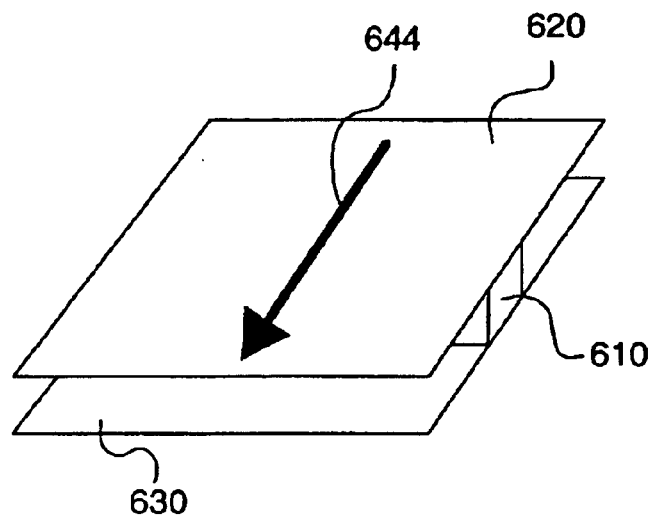
FIG. 7 is a perspective view of the frequency-modulated pumped laser shown in FIG. 6.

FIG. 7 shows a perspective view of the laser cavity 610 disposed between the two electrodes 620, 630. As shown in FIG. 7, the electrodes 620, 630 are configured as a traveling wave structure to ensure that an RF signal 644 that propagates along the electrodes has a planar wavefront. The planar wavefront of the RF signal provides that the index of refraction within the laser cavity 610 will change simultaneously with changes in the RF signal. Proper design of the electrodes will insure that the applied field is also uniform along the longitudinal direction. The electrodes may comprise microwave striplines well know in the art. Other electrode geometries and configurations may also be used.

As noted above, $LiNbO_3$ crystals can be grown having either erbium or ytterbium as the dopant. Erbium or ytterbium would provide optical gain at 1.5 or 1.06 micron wavelengths, respectively, and would be relatively unaffected by any applied electric field. The electric field applied from the electrodes 620, 630 would, however, produce the desired change in the index of refraction because of the large electro-optic effect of $LiNbO_3$. Other choices of dopants and/or host crystals could give similar results.

The maximum frequency swing achievable with the embodiments of the present invention discussed is as follows:

$$\frac{\Delta f}{f} = \frac{\Delta n}{n} \quad (4)$$

where $\Delta f$ is the frequency excursion and $\Delta n$ is the change in the index of refraction. Note that both the excursion and the upper modulation frequency, as given by equation 3, are independent of cavity length.

From the foregoing description, it will be apparent that the present invention has a number of advantages, some of which have been described above, and others of which are inherent in the embodiments of the invention described herein. Also, it will be understood that modifications can be made to the frequency modulated laser described herein without departing from the teachings of subject matter described herein. As such, the invention is not to be limited to the described embodiments except as required by the appended claims.

What is claimed is:

1. A frequency-modulated laser comprising:
   a laser cavity comprising electrically-sensitive material, said laser cavity having a length dimension and a width dimension, and said laser cavity producing laser light propagating substantially parallel to the length dimension of the laser cavity; and means for applying a uniform electric field across said laser cavity, said electric field propagating in a direction substantially perpendicular to the direction of propagation of laser light within the laser cavity and having substantially the same intensity along the length dimension of the laser cavity at any one point in time.

2. The frequency-modulated laser of claim 1, wherein said means for applying an electric field comprises a traveling-wave structure, said traveling wave-structure having a width equal to or greater than the length dimension of the laser cavity and having a length equal to or greater than the width dimension of the laser cavity, and said electric field propagating along the length of the traveling wave structure.

3. The frequency-modulated laser of claim 2, wherein said traveling wave structure comprises a first electrode and a second electrode, wherein the laser cavity is disposed between the first electrode and the second electrode.

4. The frequency-modulated laser of claim 2, wherein said traveling wave structure comprises a transmission line having a first line and a second line, wherein the laser cavity is disposed between the first line and the second line, the first line and the second line having widths greater than or equal to the length dimension of the laser cavity.

5. The frequency-modulated laser of claim 1, wherein the laser cavity comprises a laser cavity in a laser semiconductor structure.

6. The frequency-modulated laser of claim 1, wherein the laser cavity comprises a laser cavity in a pumped laser.

7. The frequency-modulated laser of claim 6, wherein said laser cavity comprises doped lithium niobate.

8. The frequency-modulated laser of claim 1, wherein said laser cavity has an index grating as a frequency-determining element, said index grating having a dielectric constant and said uniform electric field changing the dielectric constant of said index grating.

9. A method for frequency modulating a laser light signal with an electrical signal, said method comprising the steps of:

providing a laser cavity with a length and width, the laser cavity providing a lasing condition;

producing laser light within the laser cavity, the laser light propagating in a direction substantially parallel to the length dimension of the laser cavity;

maintaining the lasing condition with energy applied to a gain medium within said laser cavity;

applying the electrical signal to said laser cavity to produce an electric field uniformly and simultaneously changing the index of refraction along the length of the laser cavity in proportion to the amplitude of the electrical signal; and transmitting the laser light out of the laser cavity to provide a frequency-modulated laser light signal wherein said electric field propagates in a direction substantially perpendicular to the direction of propagation of the laser light.

10. The method of claim 9, wherein said laser cavity comprises a laser cavity within a semiconductor laser structure.

11. The method of claim 9, wherein said laser cavity comprises a laser cavity within a pumped laser.

12. The method of claim 11, wherein the step of maintaining the lasing condition comprises applying light energy at one end of said laser cavity.

13. The method of claim 11, wherein the laser comprises a side-pumped laser.

14. The method of claim 11, wherein the laser cavity comprises doped lithium niobate.

15. The method of claim 9, wherein the electrical signal is a radio frequency signal propagating within a traveling wave structure, the radio frequency signal propagating in a direction substantially perpendicular to the direction of propagation of the laser light.

16. The method of claim 15, wherein the traveling wave structure comprises a transmission line having a first line and a second line, the laser cavity being disposed between the first line and the second line, and the first line and the second line having a width greater than or equal to the length of the laser cavity.

17. The method of claim 9, wherein said laser cavity has an index grating as a frequency-determining element, said index grating having a dielectric constant and said electric field changing the dielectric constant of said index grating.

18. A frequency-modulated laser comprising:

a laser cavity comprising electrically-sensitive material having a changeable index of refraction, the laser cavity having longitudinally coincident gain and phase sections, wherein laser light propagates within the laser cavity in a direction substantially parallel to a length dimension of the laser cavity; and a traveling wave structure disposed to apply a radio frequency field across the laser cavity to change the index of refraction along the length dimension of the laser cavity length substantially simultaneously and substantially uniformly, the radio frequency field propagating in the traveling wave structure in a direction substantially perpendicular to the direction of laser light propagating in the laser cavity.

19. The frequency-modulated laser of claim 18, wherein the traveling wave structure is terminated by an external impedance device with an impedance equal to the characteristic impedance of the traveling wave structure.

20. The frequency-modulated laser of claim 18, wherein the traveling wave structure is terminated by an open circuit.

21. The frequency-modulated laser of claim 18, wherein the laser cavity comprises a laser cavity in a laser semiconductor structure.

22. The frequency-modulated laser of claim 18, wherein the laser cavity comprises a laser cavity in a pumped laser.

23. The frequency-modulated laser of claim 18, wherein said laser cavity has an index grating as a frequency-determining element, said index grating having a dielectric constant and said radio frequency field changing the dielectric constant of said index grating.

24. A laser apparatus comprising:

a laser cavity comprising electrically sensitive material, said laser cavity having longitudinally coincident gain and phase modulation sections, said laser cavity generating laser light, said laser light having a direction of propagation; and, a traveling wave structure disposed to propagate an electric field transverse to the direction of propagation of the laser light, wherein the traveling wave structure applies the electric field uniformly across said laser cavity to uniformly change an index of refraction of said electrically sensitive material.

25. The laser apparatus according to claim 24, wherein said traveling wave structure comprises at least one element selected from the group of elements comprising: a microstrip, a stripline, a coplanar strip, a slotline, a coplanar waveguide, and a rectangular waveguide.

26. The laser apparatus according to claim 24, wherein said traveling wave structure comprises a tapered structure having a maximum width adjacent said laser cavity.

* * * * *